United States Patent
Williams

(10) Patent No.: US 11,289,299 B2
(45) Date of Patent: Mar. 29, 2022

(54) DUOPLASMATRON ION SOURCE WITH A PARTIALLY FERROMAGNETIC ANODE

(71) Applicant: Arizona Board of Regents on behalf of Arizona State University, Scottsdale, AZ (US)

(72) Inventor: Peter Williams, Phoenix, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/972,384

(22) PCT Filed: Oct. 23, 2020

(86) PCT No.: PCT/US2020/057092
§ 371 (c)(1),
(2) Date: Dec. 4, 2020

(87) PCT Pub. No.: WO2021/081347
PCT Pub. Date: Apr. 29, 2021

(65) Prior Publication Data
US 2021/0375574 A1 Dec. 2, 2021

Related U.S. Application Data

(60) Provisional application No. 62/925,280, filed on Oct. 24, 2019.

(51) Int. Cl.
*H01J 27/10* (2006.01)
*H01J 49/12* (2006.01)
*H01J 9/14* (2006.01)

(52) U.S. Cl.
CPC .............. *H01J 27/10* (2013.01); *H01J 9/14* (2013.01); *H01J 49/123* (2013.01)

(58) Field of Classification Search
CPC ............................... H01J 27/10; H01J 49/123
See application file for complete search history.

(56) References Cited

U.S. PATENT DOCUMENTS 3,164,739 A  1/1965  Werner
3,458,743 A  7/1969  Cleland et al.
(Continued)

OTHER PUBLICATIONS

Notification of Transmittal of International Search Report and Written Opinion (Form PCT/ISA/220), International Search Report (Form PCT/ISA/220), and Written Opinion (Form PCT/ISA/237) for International Application No. PCT/US2020/057092 dated Jan. 25, 2021, 12 pages.

(Continued)

*Primary Examiner* — Joseph L Williams
(74) *Attorney, Agent, or Firm* — Withrow & Terranova, P.L.L.C.; Vincent K. Gustafson

(57) ABSTRACT

A duoplasmatron ion source with a partially ferromagnetic anode can be used in multiple applications, including the production of negative ions for secondary ion mass spectrometers and particle accelerators. A partially ferromagnetic anode, which may be embodied in a partially ferromagnetic anode insert, includes a ferromagnetic and non-ferromagnetic portions joined together at a juncture, with an ion extraction aperture defined in the ferromagnetic portion and the juncture being laterally offset from the aperture. An asymmetric magnetic field produced by the partially ferromagnetic region facilitates extraction of charged ions from the central, most intense region of a source plasma in the duoplasmatron ion source. A ferromagnetic conical portion of the anode defines the ion extraction aperture in order to maximize the magnetic field in the vicinity of this aperture.

20 Claims, 9 Drawing Sheets

(56) References Cited

U.S. PATENT DOCUMENTS

| | | | |
|---|---|---|---|
| 3,916,034 A * | 10/1975 | Tsuchimoto | H01J 37/3266 |
| | | | 427/571 |
| 4,093,858 A | 6/1978 | Kobayashi et al. | |
| 4,772,823 A | 9/1988 | Matsuzaki et al. | |
| 5,135,870 A | 8/1992 | Williams et al. | |
| 9,941,089 B2 | 4/2018 | Williams et al. | |
| 10,134,557 B2 | 11/2018 | Madocks | |
| 10,672,602 B2 | 6/2020 | Williams et al. | |

OTHER PUBLICATIONS

Williams, Peter, et al., "Breaking the Rules of Ion Source Design: On-Axis Negative Ion Extraction and Ion Sources Fabricated from Insulators," Proceedings of 12th International Conference on Secondary Ion Mass Spectrometry, SIMS XII, pp. 241-244, Elsevier, 2000.

Lawrence, G.P et al., "Direct Extraction of Negative Ion Beams of Good Intensity from a Duoplasmatron," Nuclear Instruments and Methods 32, pp. 357-359, North-Holland Publishing Co., 1965.

Coath, C.D. et al., "A high-brightness duoplasmatron ion source for microprobe secondary-ion mass spectrometry," Rev. Sci. Instrum. 66 (2), pp. 1018-1023, American Institute of Physics, Feb. 1995.

* cited by examiner

DUOPLASMATRON ION SOURCE WITH A PARTIALLY FERROMAGNETIC ANODE

CROSS-REFERENCE TO RELATED APPLICATION(S)

This application is a 35 U.S.C. § 371 national phase filing of International Application No. PCT/US2020/057092 filed on Oct. 23, 2020, and claims priority to U.S. Provisional Patent Application No. 62/925,280 filed on Oct. 24, 2019, wherein the entire contents of the foregoing applications are hereby incorporated by reference herein.

GOVERNMENT SUPPORT

This invention was made with government support under 1819550 awarded by the National Science Foundation. The government has certain rights in the invention.

FIELD OF THE DISCLOSURE

This application is related to ion sources for energetic ion beam production.

BACKGROUND

The duoplasmatron is a widely-used source of positive and negative ions for energetic ion beam production, invented by Manfred von Ardenne in East Germany in the 1950s. (See, e.g., 1956 *Tabellen der Elektronenphysik, Ionenphysik and Übermikroskopie. Bd.* 1. *Hauptgebiete* VEB Dt. Verl. d. Wissenschaften.) Today, duoplasmatrons are in widespread use for production of positive hydrogen ($H^+$) and negative hydrogen ($H^-$) ion beams for particle accelerators and for production of positive oxygen ($O_2^+$) and negative oxygen ($O^-$) primary ion beams to generate sputtered secondary ions in secondary ion mass spectrometers.

A duoplasmatron ion source is a gas discharge device consisting of three main components: (a) an electron-emitting cathode; (b) an intermediate, or "Zwischen" electrode (Z-electrode); and (c) a positively-charged anode with a small ion extraction aperture through which ions from the discharge are extracted. The cathode may be a filamentary cathode or a hollow cathode in a vacuum chamber into which gas is introduced to form a plasma. Conventional Z-electrodes and anodes are typically fabricated of ferromagnetic metals (typically nickel and soft iron or mild steel respectively) and form opposite poles of a magnetic circuit powered by external copper wire coils carrying an electric current, or by external permanent magnets. The function of the Z-electrode is to constrict the discharge by forcing current to pass through a small Z-electrode aperture (e.g., 1.5 mm diameter) and to further constrict the current by means of a converging magnetic field exiting the Z-electrode aperture toward the anode, with such field forcing electrons discharged from the Z-electrode to converge toward a central axis of the Z-electrode aperture.

Duoplasmatron ion sources used by most commercial secondary ion mass spectrometers utilize an anode having a 400 micron (μm) diameter hole drilled through a metal disc of a refractory metal such as molybdenum that is press-fitted into a 3 millimeter (mm) diameter hole in a ferromagnetic anode insert. Because molybdenum is non-ferromagnetic, this creates a 3 mm diameter magnetic hole in the anode magnet pole piece, which acts to expand the magnetic field, thereby distorting and somewhat negating the magnetic field concentration function of the magnetic Z-electrode.

Ions from the discharge are extracted by using a high-voltage power supply to float the duoplasmatron ion source to a positive or negative electric potential of several kilovolts while placing a grounded extraction electrode some distance (typically about 1 cm) outside the ion extraction aperture of the anode (i.e., on the side distant from the Z-electrode).

Difficulties arise when a duoplasmatron according to a traditional design is used to produce negative ions, typically of hydrogen ($H^-$) or oxygen ($O^-$, $O_2^-$) gases. Because the electron density in the discharge is some orders of magnitude greater than the negative ion density, the electron current extracted can greatly exceed the current capacity of the high-voltage power supply, which causes the high voltage potential to drop and makes the ion source inoperable unless an expensive high-current, high voltage power supply is used.

To seek to mitigate the problem of electron extraction, it is customary to translate the Z-electrode laterally so that axial centers of the Z-electrode aperture and the ion extraction aperture of the anode are displaced from one another. This is based on the belief that negative ions are concentrated at the periphery of the discharge exiting the Z-electrode aperture as suggested by Lawrence (1965, Nuclear Instruments and Methods 32:357-359). In fact, similar to the electrons and positive ions in the discharge, the negative ions in the discharge are also concentrated at the center of the discharge, collinear with the axis of the Z-electrode aperture. The effect of the off-center Z-electrode is to create an asymmetry in the magnetic field that deflects electrons extracted from the ion extraction aperture of the anode and prevents them from reaching a ground electrode and draining the power supply. But a Z-electrode aperture that is not collinearly arranged with an ion extraction aperture thus sacrifices the possibility to extract a more intense beam of negative ions from the center of the discharge.

Need therefore exists for ion sources that address limitations associated with ion sources known in the art.

SUMMARY

A duoplasmatron ion source, a partially ferromagnetic anode for a duoplasmatron ion source, and method for producing a partially ferromagnetic anode for a duoplasmatron ion source are provided. The duoplasmatron ion source can be used as an ion source in multiple applications, including secondary ion mass spectrometers and particle accelerators. An anode comprises a partially ferromagnetic region, including a ferromagnetic portion joined with a non-ferromagnetic portion at a juncture that is laterally offset from an ion extraction aperture. A majority of the partially ferromagnetic region may comprise ferromagnetic material. In operation, the partially ferromagnetic anode region is configured to produce a magnetic field that may deflect electrons exiting the ion extraction aperture, thereby reducing or eliminating transit of electrons from the ion extraction aperture to contact a grounded electrode with which the duoplasmatron is configured to operate.

In one aspect, the disclosure relates to a duoplasmatron ion source configured to be positioned proximate to a grounded electrode, the duoplasmatron ion source comprising a cathode, an anode, and a Zwischen electrode (Z-electrode) arranged between the cathode and the anode, the Z-electrode defining a Z-electrode aperture. The anode comprises a partially ferromagnetic region that comprises a ferromagnetic portion joined with a non-ferromagnetic portion at a juncture, the ferromagnetic portion defining an ion extraction aperture, wherein the juncture is laterally offset from the ion extraction aperture. The partially ferromagnetic anode region is configured to produce a magnetic field that reduces or eliminates transit of electrons from the ion extraction aperture to contact the grounded electrode.

In certain embodiments, the anode comprises a removable insert that forms the partially ferromagnetic region. In certain embodiments, the removable insert comprises a threaded surface configured to engage a threaded receiving aperture of the anode defined in a ferromagnetic remainder of the anode.

In certain embodiments, the juncture is laterally offset from the ion extraction aperture by a distance of at least 3 mm (e.g., by a distance of approximately 5 mm in certain embodiments).

In certain embodiments, each of the ferromagnetic portion and the non-ferromagnetic portion is metallic (i.e., formed of a metal or metal alloy). In certain embodiments, the ferromagnetic portion comprises a ferrous metal. In certain embodiments, the non-ferromagnetic portion comprises a non-ferromagnetic stainless steel alloy.

In certain embodiments, the duoplasmatron ion source may be configured to produce positive ions and/or negative ions.

In certain embodiments, the duoplasmatron ion source is configured to produce negative ions, wherein the Z-electrode aperture is coaxially aligned (or nearly coaxially aligned) with the ion extraction aperture.

In certain embodiments, the partially ferromagnetic anode region has a conical cross-sectional shape that is convex toward the Z-electrode aperture. This conical geometry increases the concentration of the magnetic field between the Z-electrode and the anode at the position of the ion extraction aperture.

Another aspect of the disclosure is directed to a partially ferromagnetic anode for a duoplasmatron ion source that is configured to be positioned proximate to a grounded electrode and configure to form part of a magnetic circuit. The partially ferromagnetic anode comprises a partially ferromagnetic region that comprises a ferromagnetic portion joined with a non-ferromagnetic portion at a juncture, the ferromagnetic portion defining an ion extraction aperture; wherein the juncture is laterally offset from the ion extraction aperture; and wherein the partially ferromagnetic region is configured to produce a magnetic field that reduces or eliminates transit of electrons from the ion extraction aperture to contact the grounded electrode.

In certain embodiments, the partially ferromagnetic anode comprises a removable insert that forms the partially ferromagnetic region. In certain embodiments, the removable insert comprises a threaded surface configured to engage a threaded receiving aperture of the partially ferromagnetic anode.

In certain embodiments, the partially ferromagnetic region is formed integrally with a remainder of the partially ferromagnetic anode.

In certain embodiments, the juncture is laterally offset from the ion extraction aperture by a distance of at least 3 mm (e.g., by a distance of approximately 5 mm in certain embodiments).

In certain embodiments, at least a portion of the partially ferromagnetic region defining the ion extraction aperture has a conical cross-sectional shape; the partially ferromagnetic anode separates an upstream region containing an ion-producing discharge and a downstream region through which ions are accelerated toward the grounded electrode; and the partially ferromagnetic anode is convex in a direction toward the upstream region.

In another aspect, the disclosure relates to a method for producing a partially ferromagnetic anode for a duoplasmatron ion source. Such method comprises joining a non-ferromagnetic material with a ferromagnetic material at a juncture to produce a partially ferromagnetic stock, followed by processing the partially ferromagnetic stock to form a partially ferromagnetic anode region, wherein the ferromagnetic portion defines an ion extraction aperture, and the juncture is laterally offset from the ion extraction aperture.

In certain embodiments, joining the non-ferromagnetic material with the ferromagnetic material comprises brazing a ferromagnetic metal with a non-ferromagnetic metal.

In certain embodiments, processing the partially ferromagnetic stock comprises forming at least a portion of the partially ferromagnetic anode region into a conical shape.

In another aspect, any of the foregoing aspects and/or features according to various embodiments disclosed herein may be combined for additional advantage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
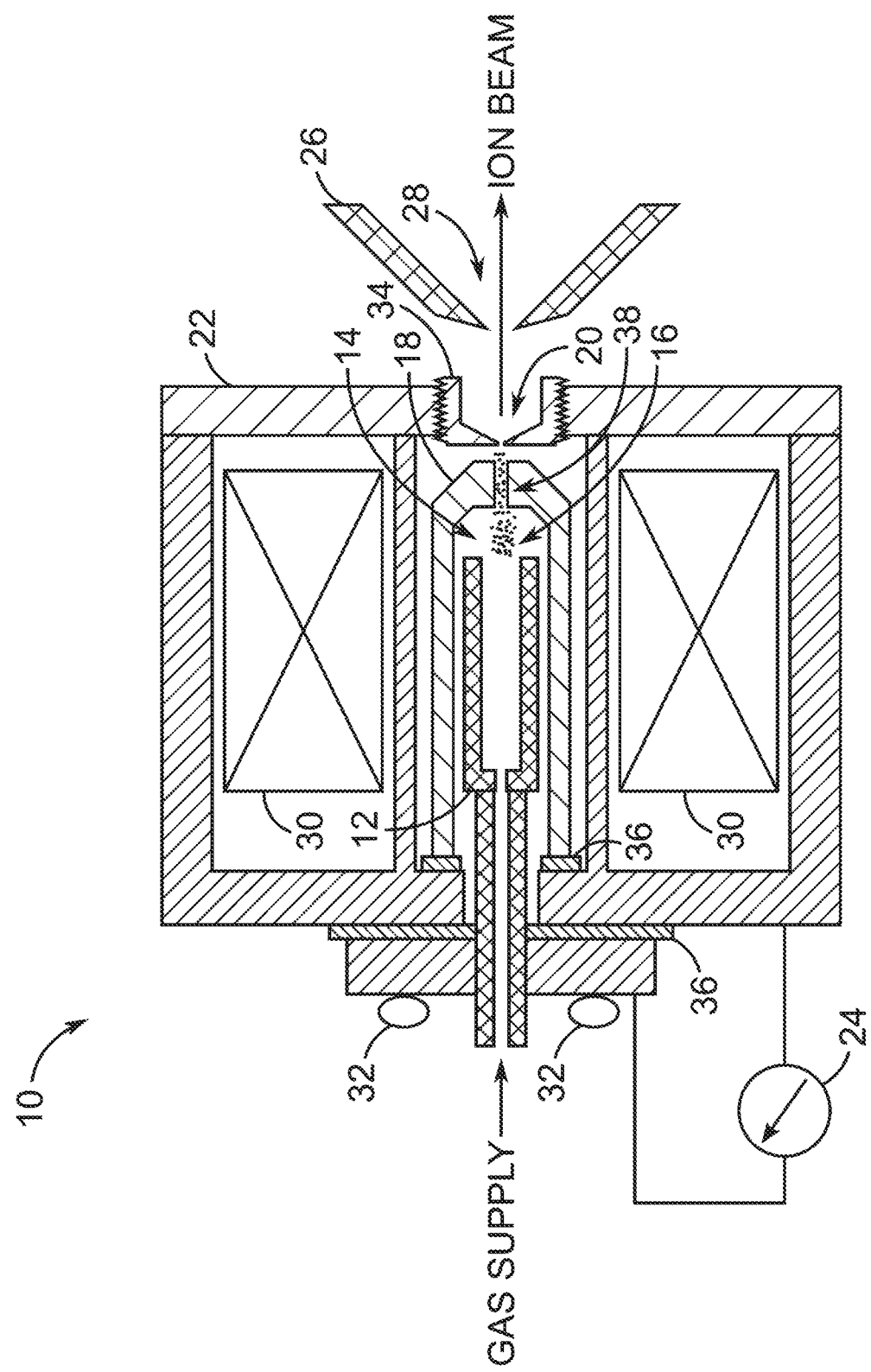
FIG. 1 is a cross-sectional view of an exemplary duoplasmatron ion source according to one or more embodiments of the present disclosure.

A duoplasmatron ion source, a partially ferromagnetic anode for a duoplasmatron ion source, and method for producing a partially ferromagnetic anode for a duoplasmatron ion source are provided. An anode comprises a partially ferromagnetic region, including a ferromagnetic portion joined with a non-ferromagnetic portion at a juncture that is laterally offset from an ion extraction aperture. The partially ferromagnetic region is configured to produce a magnetic field that may deflect electrons exiting the ion extraction aperture. Provision of a partially ferromagnetic anode with a juncture between ferromagnetic and non-ferromagnetic portions that is offset from the ion extraction aperture permits the ion extraction aperture to be coaxially arranged (or nearly coaxially arranged) with the Z-electrode aperture. A magnetic asymmetry produced by the partially ferromagnetic anode region allows ions to be extracted from the ion extraction aperture coaxially aligned with the Z-electrode aperture while suppressing transit of electrons to a grounded electrode with which the duoplasmatron ion source is configured to operate.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Approximate terms used herein, such as "about," "approximate," or "approximately," should be understood as defining an appropriate range about a given value, as will be understood by one of skill in the art. Unless otherwise defined, such terms are defined to mean a range within +/−five percent of the values provided.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, the term "ferromagnetic" refers to a material that exhibits a strong attraction to a magnetic field, with examples including (but not limited to) iron, cobalt, nickel, magnetite, dysprosium, and gadolinium, and the like.

As used herein, the term "non-ferromagnetic" refers to materials other than ferromagnetic materials.

As used herein, the term "partially ferromagnetic" refers to an element (e.g., anode) of which one portion is ferromagnetic and another portion is non-ferromagnetic.

As used herein, the term "magnetic circuit" refers to a closed loop path containing a magnetic flux, wherein the magnetic flux may transit a gap (e.g., a gap between the Z-electrode and the anode of a duoplasmatron ion source).

A duoplasmatron ion source with a partially ferromagnetic anode is provided. The duoplasmatron ion source can be used as an ion source in multiple applications, including secondary ion mass spectrometers and particle accelerators. The partially ferromagnetic anode includes a partially ferromagnetic region, such as a partially ferromagnetic anode insert, defining an ion extraction aperture through a ferromagnetic portion of the partially ferromagnetic region. In a partially ferromagnetic region (e.g., a partially ferromagnetic insert) of an anode according to certain embodiments, a larger mass fraction and larger volume fraction of material may be ferromagnetic (as opposed to non-ferromagnetic). A partially ferromagnetic region has a ferromagnetic portion and a non-ferromagnetic portion that are joined together at a juncture, and are processed to form the ion extraction aperture. This partially ferromagnetic anode region is configured to produce a magnetic field that may deflect electrons exiting the ion extraction aperture, even when the ion extraction aperture is arranged coaxially with a Z-electrode aperture of a corresponding Z-electrode. Such deflection prevents electrons from reaching a ground electrode with which the duoplasmatron ion source is configured to operate. Coaxial alignment between a Z-electrode aperture and an ion extraction aperture permits extraction of positive or negative ions from the central, most intense region of a source plasma in the duoplasmatron ion source.

FIG. 1 is a schematic diagram of an exemplary duoplasmatron ion source 10 that may utilize a partially ferromagnetic anode region according to embodiments of the present disclosure. The duoplasmatron ion source 10 provides an ion beam from a gas supply. A negatively-charged cathode 12 emits electrodes into a vacuum chamber 14. The cathode 12 can be an electrically-heated metal filament (a thermionic cathode) or a hollow cathode consisting of an unheated metal cylinder.

As the gas supply is introduced into the vacuum chamber 14 (e.g., through a gas supply aperture in or adjacent the cathode 12), a plasma 16 of ionized particles is produced through electron bombardment of the gas supply. An intermediate, or "Zwischen" electrode (e.g., Z-electrode 18) constricts the discharge, both with a physical constriction and a converging magnetic field in the region between the exit of the Z-electrode 18 and the anode 22. Positive or negative ions from the plasma 16 are then accelerated through an ion extraction aperture 20 defined by the anode 22 to produce the ion beam.

In some examples, the duoplasmatron ion source 10 is operated with a potential difference of around 300 volts (V) between the cathode 12 and the anode 22 (e.g., provided by an arc current source 24), which is enough to sustain an arc discharge when the gas pressure in the duoplasmatron ion source 10 is on the order of approximately 0.1-1 torr. The ion extraction aperture 20 also serves as a differential pumping aperture, allowing an internal gas pressure high enough to sustain an arc discharge while maintaining an external gas pressure in the $10^{-5}$ $10^{-4}$ torr range to allow extracted ions to be accelerated without an unacceptable amount of scattering collisions with the gas outside the duoplasmatron ion source 10.

The entire duoplasmatron ion source 10 is floated at an accelerating potential on the order of a few to several tens of kilovolts (kV). Depending on the polarity of the accelerating potential, either positive or negative ions from the electron-ion plasma 16 at the anode 22 surface can exit the ion extraction aperture 20 and be accelerated towards an extraction electrode 26 at ground potential situated a short distance (e.g., on the order of a centimeter) from the external surface of the ion extraction aperture 20. An extraction electrode aperture 28 in the extraction electrode 26 allows the ions to pass through and enter an ion optical column.

The defining feature of the duoplasmatron ion source 10 is the dual role played by the Z-electrode 18 in constricting the discharge. The Z-electrode 18 contains a small channel through which the discharge current is constrained to pass. In secondary ion mass spectrometry (SIMS) instruments, the channel diameter ranges from 1 to 2 millimeters (mm), but wider channels may be used in higher-current duoplasmatron ion sources 10. The effect of constraining the discharge to a smaller cross-sectional area is to increase the ion current density and thus the plasma 16 density at the ion extraction aperture 20. Importantly, a further constriction of the plasma 16 is achieved by fabricating the Z-electrode 18 of a ferromagnetic metal (usually nickel) and making this electrode part of a magnetic circuit in which the Z-electrode 18 and the anode 22 are the two poles of the magnet, with a strong magnetic field (e.g., from one or more external magnets 30, which may be permanent magnets or electromagnets) produced in the gap between the two. This gap is typically on the order of 1-2 mm. The magnetic field between the Z-electrode channel and the anode 22 is strongly converging toward a central axis extending from the Z-electrode channel to the ion extraction aperture 20, and this converging magnetic field further constructs the discharge plasma toward the central axis and further increases the discharge current density impacting the ion extraction aperture 20.

In some examples, the duoplasmatron ion source 10 includes additional components. For example, the duoplasmatron ion source 10 may include one or more coolant channels 32 for cooling the magnets 30 or other components of the duoplasmatron ion source 10.

In an exemplary embodiment, the cathode 12 is a hollow cathode. The anode 22 includes a partially ferromagnetic anode insert 134 (i.e., in place of a conventional anode insert 34), through which the ion extraction aperture 20 is defined, and is further described hereinafter in connection with FIGS. 3A-3B. The anode 22 (e.g., anode plate), partially ferromagnetic anode insert 34, and Z-electrode 18 of the duoplasmatron ion source 10 comprise ferromagnetic materials and form two poles of a magnetic circuit. In some examples, the anode 22 is fabricated of mild steel and the Z-electrode 18 is fabricated of nickel. A mild steel return yoke of the magnetic circuit (not shown) passes outside and behind the magnets 30 (e.g., magnet coils) and connects the anode 22 and Z-electrode 18 magnetically, and also completes the vacuum chamber 14 of the duoplasmatron ion source 10.

In conventional duoplasmatron sources, an ion extraction aperture is drilled through a disc of a refractory (and non-ferromagnetic) metal such as molybdenum (i.e., an "ion extraction anode aperture disc") that is press-fitted into a 3 mm diameter hole in a fully magnetic (e.g., fully ferromagnetic) anode insert (instead of the novel partially ferromagnetic anode insert 34 disclosed herein). Thus, there is a 3 mm diameter magnetic hole in the magnet pole piece of the anode. The result of this magnetic hole is to cause the converging magnetic field from the exit of the Z-electrode to re-diverge, which can reduce the discharge current density impacting the ion extraction aperture and reduce the ion current that can be extracted through the ion extraction aperture. One aspect of the present invention is intended to avoid the presence and effects of this magnetic hole.

In some examples, the hollow cathode 12 is also nickel (and thus ferromagnetic), but a ferromagnetic hollow cathode 12 is not required, and non-ferromagnetic cathode materials (e.g., molybdenum) can also be used. Nickel may be preferred for operation with an oxygen discharge because nickel forms an oxide surface that readily emits secondary electrons for the discharge. Electrical insulation of the cathode 12 from the anode 22 is accomplished with a thin insulating layer 36 (e.g., a sheet of Teflon insulator) between the mounting flange for the cathode 12 (not shown) and the vacuum chamber 14.

The Z-electrode 18 is further insulated from the assembly and typically is allowed to float electrically. The cathode-plus-Z-electrode assembly can be moved laterally on- and off-axis (e.g., vertically as shown in the diagram) by a screw external to the vacuum chamber 14, with the assembly sliding on the insulating layer 36 (e.g., the Teflon sheet) that acts to insulate the cathode 12 from the anode 22. The duoplasmatron ion source 10 in FIG. 1 is shown with an assembly of the cathode 12 and Z-electrode 18 displaced vertically so that the ion extraction aperture 20 aligns with the edge of a Z-electrode aperture 38 of the Z-electrode 18.

Figure 2:
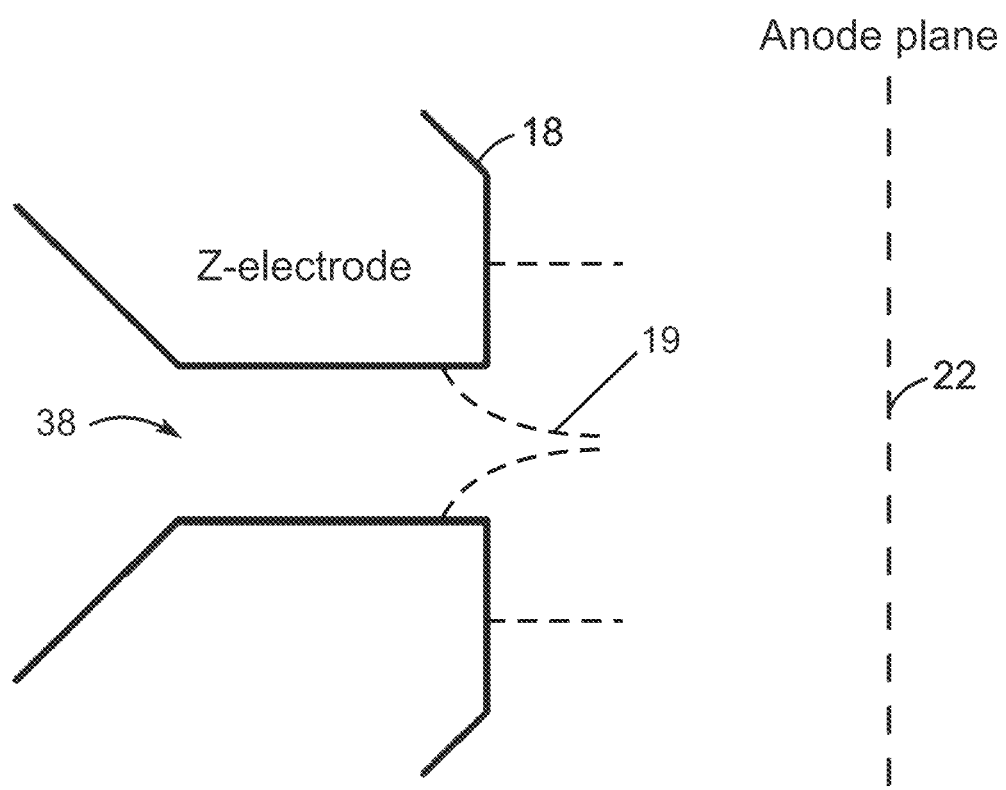
FIG. 2 is a schematic diagram of a Zwischen electrode (Z-electrode) of the duoplasmatron ion source of FIG. 1, illustrating the function of magnetic constriction provided by the Z-electrode.

FIG. 2 is a schematic diagram of the Z-electrode 18 of the duoplasmatron ion source 10 of FIG. 1, illustrating the function of the magnetic constriction produced by the Z-electrode 18. The dashed lines 19 emanating from the Z-electrode 18 depict magnetic lines of force. One basic feature of magnetic fields is that near a flat magnetic surface, the magnetic field is perpendicular to the surface. Thus, the lines of force emanating from the portion of the Z-electrode 18 parallel to the surface of the anode 22 (i.e., at the top and bottom of FIG. 2) are directed perpendicularly toward the anode 22. However, lines of force emanating from the interior surface of the Z-electrode aperture 38 initially are directed radially inward as shown. The lines of force cannot cross each other and so they curve as shown to produce a powerful constricting effect on the electrons in the discharge.

The light electrons moving from the cathode 12 through the Z-electrode aperture 38 are constrained to spiral around, and thus to follow, the lines of force. This produces a significant additional constriction in the discharge current and thus further increases the current density in the discharge that impacts the region of the ion extraction aperture 20. These two constrictions—mechanical and magnetic—together are intended to produce a high ion density along the axis of the Z-electrode 18 and thus at the ion extraction aperture 20 if this ion extraction aperture is arranged coaxially with the Z-electrode aperture 38.

It should be noted that in traditional designs, the practice of fabricating a disc defining the ion extraction aperture 20 from some non-ferromagnetic refractory material (e.g., molybdenum) must lead to some divergence of the magnetic field near the ion extraction aperture 20, possibly reducing the arc density and somewhat negating the converging function of the magnetic Z-electrode 18.

Traditional duoplasmatron designs with ion extraction apertures 20 defined by non-ferromagnetic materials may function as designed for production of positive ions from a variety of gases, such as hydrogen, oxygen, and argon. However, issues arise when it is desired to extract negative ions (e.g., of hydrogen or oxygen) from the discharge. If the Z-electrode anode aperture 38 is arranged coaxially with the ion extraction aperture 20, then an intense flux of electrons is extracted from the discharge which can be over 1000 times greater than the negative ion flux and can overload the high-voltage power supply.

Authors of a 1965 paper (G. P. Lawrence, R. K. Beauchamp, and J. L. McKibben, Nucl. Instr. Methods 32, 357 (1965)), reported using a traditional negative hydrogen (H$^-$) duoplasmatron source with a high arc current (2 amps (A)), yielding maximum electron currents up to 260 milliamps (mA) compared to maximum H$^-$ currents around 65 microamps (µA). The high electron currents were obtained with the Z-electrode aperture 38 centered on the anode ion extraction aperture 20, while the highest ion currents were obtained with the Z-electrode 18 offset from the anode ion extraction aperture 20. For reasons not explained in the paper, when the Z-electrode 18 was centered on the ion extraction aperture 20, the H$^-$ current fell to zero. It seems probable that the high electron currents loaded down the high voltage power supply so that the lower H$^-$ ion energy was incorrect for the H$^-$ beam to pass through the mass analyzer used for the paper.

One reported solution to these issues was to displace the axis of the Z-electrode 18 sideways relative to the ion extraction aperture 20. This caused the electron current to drop to zero at a displacement of 0.035 inches (in), while the H$^-$ current increased to a maximum of 65 µA at this displacement. The authors of the 1965 paper speculated that the H$^-$ ions were being produced in a diffuse "sheath" region surrounding the high-intensity central core of the discharge and that the relatively fragile H$^-$ ions (having electron affinity of approximately 0.7 electron-volts) were mostly destroyed in this central core. This sheath argument has been repeated in many subsequent papers and duoplasmatrons have been designed to try to specifically extract these supposed sheath ions, but with little to no success in improving source performance. The argument is in fact incorrect.

This technique of displacing the Z-electrode 18 sideways to extract negative ions has become common practice in secondary ion mass spectrometry, where it is desirable to use negative oxygen (O$^-$) ions to sputter insulating targets because charging of the sample is thereby minimized. In one secondary ion mass spectrometer design (NanoSIMS, Cameca-Ametek, Paris, France), use of an O$^-$ primary ion beam to produce positive secondary ions is essential because the design requires an opposite primary ion polarity to that of the positive secondary ions. Typically, O$^-$ primary ion currents produced by this Z-electrode 18 displacement technique are lower by a factor of approximately ten (10) than the positive oxygen (O$_2^+$) ion currents produced with an on-axis Z-electrode 18. As a result, the minimum focused beam size is also degraded for negative ions compared to positive ions. The minimum focused beam size for O$^-$ primary ions in the NanoSIMS secondary ion mass spectrometer is specified by the manufacturer to be 200 nanometers (nm).

Figure 3A:
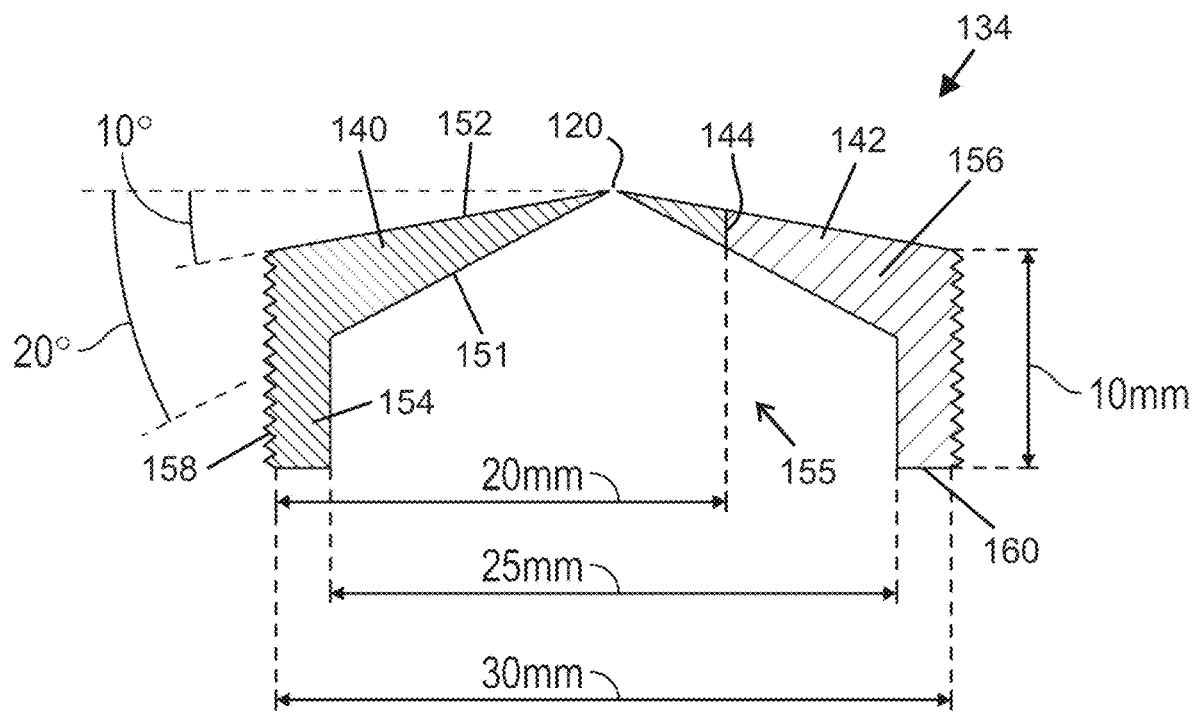
FIG. 3A is a side cross-sectional view of a partially ferromagnetic anode insert for a duoplasmatron ion source such as depicted in FIG. 1.
Figure 3B:
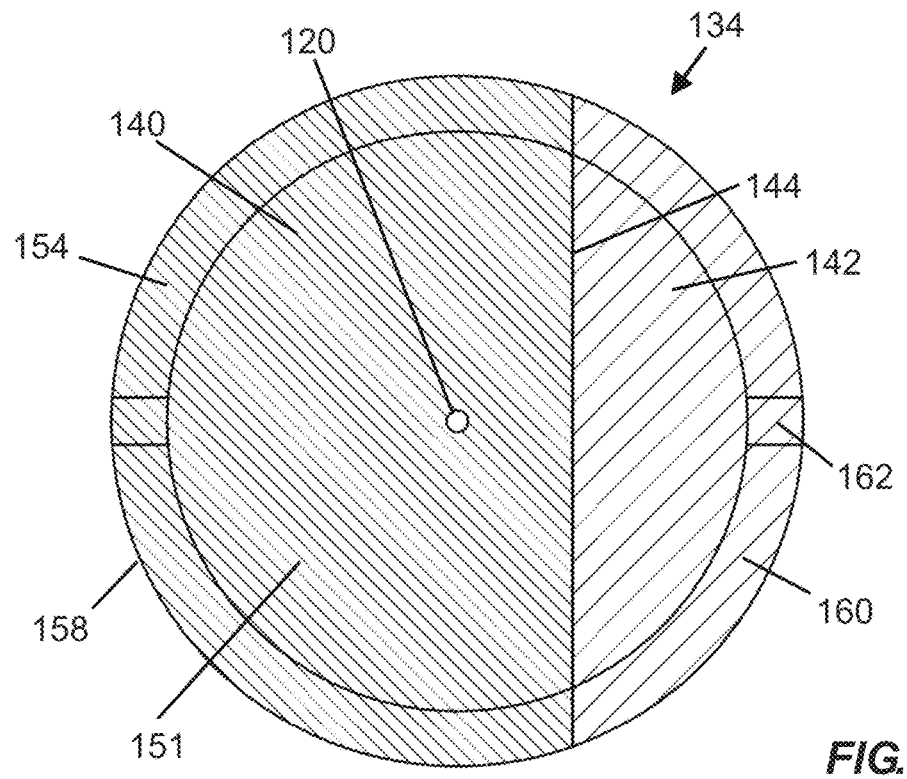
FIG. 3B is a bottom plan view of the partially ferromagnetic anode insert of FIG. 3A.

FIGS. 3A and 3B are side cross-sectional and bottom plan views, respectively, of the partially ferromagnetic anode insert 34 of FIG. 1. The partially ferromagnetic anode insert 34 replaces the traditional magnetic anode insert with a non-ferromagnetic (e.g., molybdenum) ion extraction aperture described above. The design of the partially ferromagnetic anode insert 34 was derived from the realization that the sheath postulate—i.e., the idea that negative ions are produced only in the periphery of the discharge and are destroyed in the high-intensity central region—is incorrect. In fact, as will be shown below, both positive and negative ion populations are maximized on the axis of the discharge due to the concentrating effect of the Z-electrode 18. Displacement of the Z-electrode 18 (and thus the axis of the discharge) under a traditional approach does not align the ion extraction aperture 20 with a higher-density region of negative ion production, but instead simply introduces a magnetic asymmetry into the system that acts to deflect any electrons extracted together with the negative ions so that they do not reach the ground electrode and so do not act to drain the accelerating voltage power supply. But this displacement then means that the ion extraction aperture 20 under the traditional approach is no longer sampling the central, most intense portion of the discharge.

In contrast, the partially ferromagnetic anode insert 134 of FIGS. 3A-3B includes a ferromagnetic portion 140 and a non-ferromagnetic portion 142. This anode insert 134 may be used in place of the anode insert 34 in the duoplasmatron ion source 10 of FIG. 1. An ion extraction aperture 120 is defined in the ferromagnetic portion 140. The ferromagnetic portion 140 and the non-ferromagnetic portion 142 are joined at a juncture 144 that is laterally offset (e.g., 5 mm in the depicted embodiment) from the center line of the partially ferromagnetic anode insert 134 (which is concentric with a center line of an anode, such as anode 22 in FIG. 1). With this lateral offset, and with the Z-electrode (18 shown in FIG. 1) located a small distance (e.g., no more than 2 mm in the embodiment depicted in FIG. 1) away from the anode, the magnetic field in the gap (e.g., 1.5 to 2 mm) between the anode (22 in FIG. 1) and the Z-electrode (18 in FIG. 1) is minimally distorted from axial symmetry.

Thus, the ferromagnetic portion 140 and the non-ferromagnetic portion 142 of the partially ferromagnetic anode insert 134 are joined at the juncture 144 having a lateral offset sufficient such that the magnetic field in the region of the ion extraction aperture 120 is not affected by the magnetic field asymmetry caused by the partially ferromagnetic anode insert 134. Thus, when the partially ferromagnetic ion anode insert 134 is used in the duoplasmatron ion source 10, the ion source 10 retains an optimal axial symmetry.

In some examples, the partially ferromagnetic anode insert 134 is fabricated with a conical shape (e.g., a conical shape that is convex toward the Z-electrode 18 in FIG. 1). This acts to concentrate the magnetic field towards the center of the anode (e.g., anode 22 in FIG. 1) incorporating the partially ferromagnetic anode insert 134 (e.g., at an apex of the cone where the ion extraction aperture 120 is positioned). In some examples, the ion extraction aperture 120 is drilled directly into the ferromagnetic portion 140 of the partially ferromagnetic anode insert 134 so that the magnetic field remains as concentrated as possible in the region of the ion extraction aperture 120. As a result, there is no "magnetic hole" in the anode 22 as with the traditional non-ferromagnetic (e.g., molybdenum) ion extraction aperture piece.

With continued reference to FIGS. 3A-3B, the partially ferromagnetic anode insert 134 includes a tubular portion 154 and a conical tapered portion 156. The conical tapered portion 156 has an outer surface 151 and an inner surface 152. A cavity 155 is bounded by the tubular portion 154 and the outer surface 151 of the conical tapered portion 156. As shown, relative to a central axis definable through the ion extraction aperture 120, the outer surface 151 of the conical tapered portion 156 may be angled 20 degrees (i.e., 20±5 degrees in certain embodiments) from perpendicular to the central axis, and the inner surface 152 of the conical tapered portion 156 may be angled 10 degrees (i.e., 10±5 degrees in certain embodiments) from perpendicular to the central axis. The partially ferromagnetic anode insert 134 further includes an outwardly threaded lateral surface 158 that permits the partially ferromagnetic anode insert 134 to be removably received within a corresponding inwardly threaded aperture (not shown) of an anode of a duoplasmatron ion source. Referring to FIG. 3B, the tubular portion 154 is bounded by an end surface 160 that defines two notches 162 that may be used to receive a tool (not shown) to facilitate screwing of the partially ferromagnetic anode insert 134 into a ferromagnetic remainder of an anode. As shown, the juncture 144 between the ferromagnetic and non-ferromagnetic portions 140, 142 may comprise a linear interface in certain embodiments. In other embodiments, a non-linear (e.g., curved) interface may be provided. In certain embodiments, the juncture 144 may comprise a brazed or soldered interface.

In the exemplary embodiment depicted in FIGS. 3A-3B, the partially ferromagnetic anode insert 134 has an outer diameter of 30 mm, an inner diameter of 25 mm, and a depth of 10 mm along the outwardly threaded lateral surface 158. It should be understood that these dimensions are exemplary in nature, and other embodiments may be sized differently. The ion extraction aperture 120 may also have different diameters, such as 400 µm or 600 µm according to the desired end use.

In certain embodiments, the ferromagnetic portion 140 of the partially ferromagnetic anode insert 134 can be formed of soft iron, nickel, mild steel, or another appropriate ferromagnetic material. In certain embodiments, the non-ferromagnetic portion 142 can be formed of a non-ferromagnetic stainless steel alloy or another appropriate nonmagnetic material compatible for bonding with the ferromagnetic portion 140. In an exemplary embodiment, the ferromagnetic portion 140 and the non-ferromagnetic portion 142 are brazed together then machined. In other examples, the ferromagnetic portion 140 and the non-ferromagnetic portion 142 can be joined through another appropriate technique, such as soldering, welding, molding, an adhesive, and so on.

It is to be recognized that the partially ferromagnetic anode insert 134 may be threaded or otherwise machined to facilitate securing the insert within an anode (22 in FIG. 1, optionally embodied in an anode plate). In certain embodiments, a partially ferromagnetic anode region 134 may be formed integrally with, or otherwise coupled with, an anode 22, thereby providing a partially ferromagnetic region proximate to an ion extraction aperture.

Figure 4:
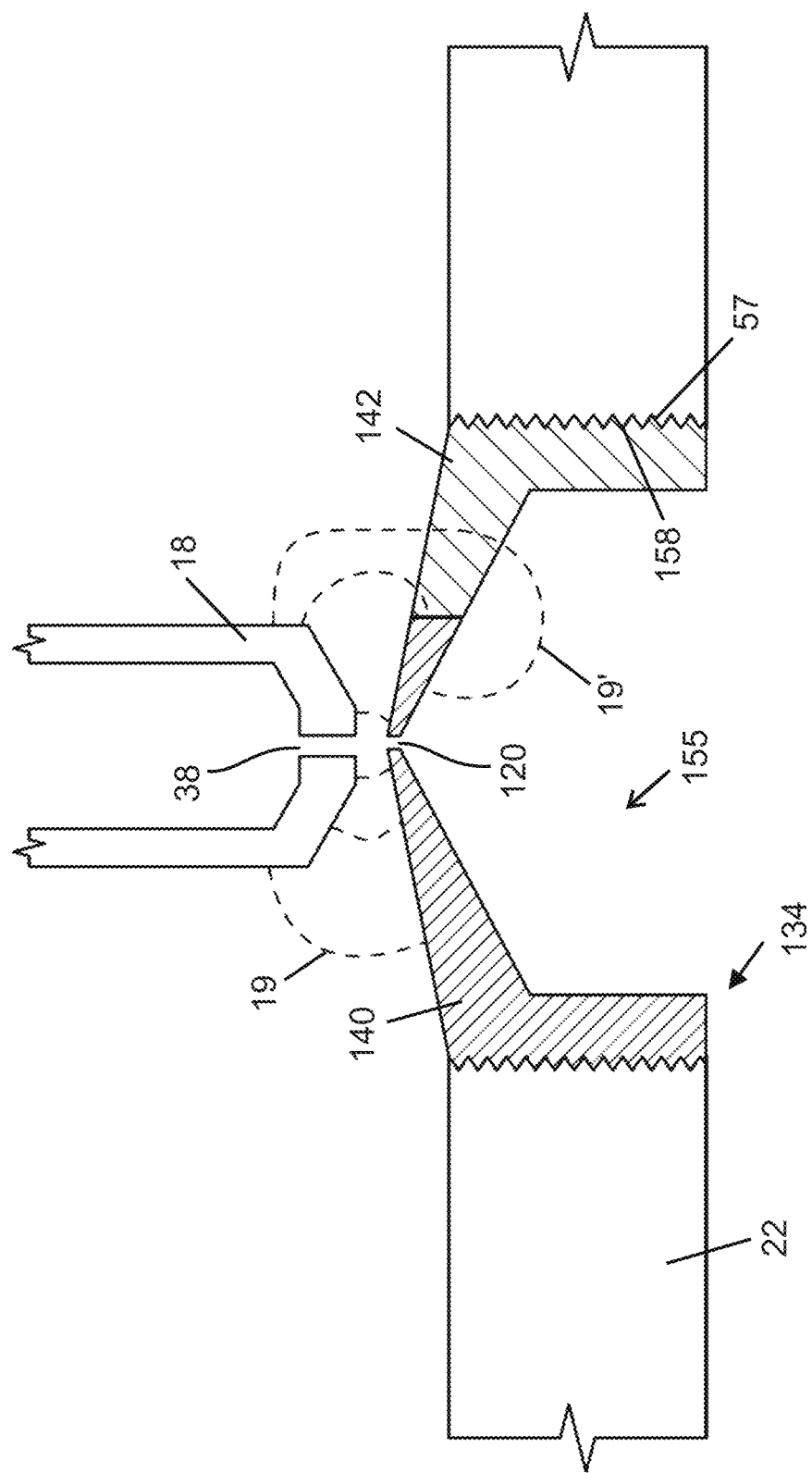
FIG. 4 is a cross-sectional schematic view of a Z-electrode arranged proximate to an anode comprising a partially ferromagnetic anode insert according to FIGS. 3A-3B, with illustration of magnetic field lines penetrating the non-ferromagnetic material into a region downstream of the ion extraction aperture.

FIG. 4 is a cross-sectional schematic view of a Z-electrode 18 arranged proximate to an anode (e.g., an anode plate) 22 comprising the partially ferromagnetic anode insert 134 of FIGS. 3A-3B. The outwardly threaded lateral surface 158 of the partially ferromagnetic anode insert 134 is received by an internally threaded aperture 57 of the anode plate 22. The ion extraction aperture 120 defined in the ferromagnetic portion 140 of the partially ferromagnetic insert 134 is arranged proximate to, and is coaxially aligned with, the Z-electrode aperture 38 defined by the Z-electrode 18. Magnetic field lines 19 depict a magnetic field emanating from the Z-electrode 18. As shown, portions of the magnetic field 19 that impinge on the ferromagnetic portion 140 of the partially ferromagnetic anode insert 134 do not extend into the cavity 155, whereas a portion of the magnetic field 19' penetrates the non-ferromagnetic portion 142 into the cavity 155 and therefore may influence the trajectory of (e.g., deflect) electrons that pass through the ion extraction aperture 120 to reduce or eliminate the transit of electrons to a grounded electrode (not shown).

The magnitude of the ion currents that can be extracted from the duoplasmatron design described here, or any other design, is dependent upon the electric field strength at the front surface (i.e. distant from the Z-electrode) of the plasma within the ion extraction aperture. This field strength is a function of the voltage difference between the anode and the nearby ground electrode and the spacing between these two components, but is also a function of the detailed shape of the ion extraction aperture. For low arc currents, no greater than 100 mA as used in the secondary ion mass spectrometers discussed above, the discharge plasma interface is located at the base of the ion extraction aperture, distant from the grounded extraction electrode. It is known that electric fields penetrating into an aperture in a conducting metal are attenuated as the penetration distance increases. An approximation commonly understood in the field is that the electric field strength decreases by about a factor of 10 at a depth comparable to the aperture diameter. Therefore, the electric field acting to extract ions from the plasma discharge may be reduced by as much as a factor of 10 if the depth of the ion extraction aperture is similar to its diameter. It is therefore beneficial to keep this aperture depth to a minimum: in some of the results described here the aperture depth was no greater than approximately one-fourth to one-third of the aperture diameter, i.e. 150-200 µm for a 600 µm diameter aperture.

Performance

The partially ferromagnetic anode insert 134 of FIGS. 3A-3B has been evaluated for O⁻ ion beam production in two secondary ion mass spectrometry (SIMS) instruments: an ion microscope and an ion microprobe. The requirement in the microscope is typically a large beam current (with reasonable focused spot size at the sample) to facilitate rapid analyses. In the ion microprobe, rapid analysis is also important, but in addition the smallest possible focused spot on the sample is desirable.

Importantly, the first observation from these evaluations was that the maximum extracted ion current for both positive and negative ions was obtained with the same, approximately on-axis, position of the Z-electrode 18. This finding definitively negates the "sheath" hypothesis described above and validates the design philosophy of the partially ferromagnetic anode insert 134 depicted in FIGS. 3A-3B.

Ion microscope performance: The ion microscope uses an imaging approach called ion microscopy, in which the sample is illuminated by a primary ion beam rastered over a several hundred micrometer square area and imaging is accomplished using stigmatic ion lenses operating on the sputtered secondary ion beam. Thus, extremely small focused primary ion beams are not required for imaging. Instead, the highest achievable total currents are desired, together with the highest achievable current density in a focused beam. A major analytical use of the ion microscope is for "depth profiling", in which several ion species in the sample are monitored as a function of time as a flat-bottomed crater is eroded into the sample.

Requirements for the primary beam in such depth profiles are: (a) a reasonably well focused primary ion beam (approximately 10-30 µm diameter) that can produce a uniform flat-bottomed crater when rastered over a square area of approximately 200 µm on a side; (b) the largest available current into the 10-30 µm beam spot to achieve the fastest possible analysis; and (c) a relatively short penetration depth of the primary ion species into the sample. The depth resolution achievable in such analyses is limited by the primary ion penetration depth as the penetrating ions displace and mix the subsurface atoms over this depth. Depth resolution can be improved by using a lower primary ion impact energy, but lowering the energy can compromise primary ion performance—ion extraction efficiency from the ion source is reduced and the beam focusing is worse at lower energies. An alternative approach is to use a molecular ion species such as $O_2^-$. On impact with the surface, this ion species fragments into two independent O atom projectiles, each with half the initial particle energy, and so with half the penetration depth. However, with the traditional duoplasmatron source, $O_2^-$ currents are too low to be useful.

With the traditional duoplasmatron source, typical maximum primary current values ($I_p$) were:
  $O_2^+$ maximum current: ~1 µA
  O⁻ maximum current: ~1 µA
  $O_2^-$ maximum current: ~200-300 nA
Data for $O_2^+$ and O⁻ are according to the manufacturer's specifications.

Using the partially magnetic anode insert 134 with a 600 µm ion extraction aperture 120 mounted in the ion microscope duoplasmatron (and all other primary ion column parameters remaining the same as for the traditional duoplasmatron source), the following performance figures were achieved:
  $O_2^+$ maximum current: ~6 µA
  O⁻ maximum current: ~6 µA
  $O_2^-$ maximum current:
  These current performance figures are thus a factor of ~6 better than the traditional duoplasmatron design.

Figure 5:
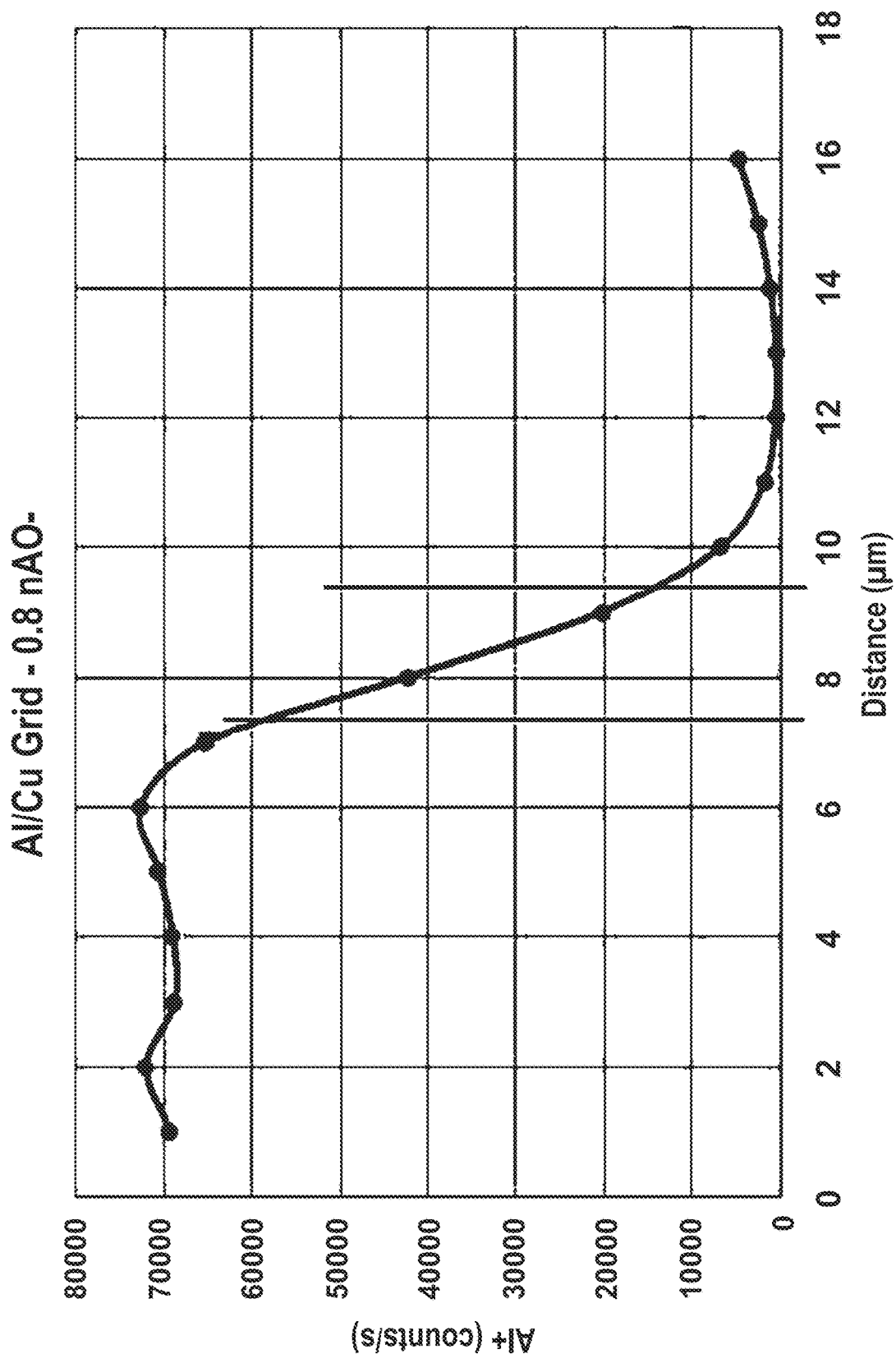
FIG. 5 is a graphical representation (in Al+ counts versus distance in μm) of measurements of a negative oxygen (O⁻) ion primary beam size in an ion microscope using the duoplasmatron ion source of FIG. 1.

FIG. 5 is a graphical representation of measurements of an O⁻ ion primary beam size in the ion microscope using the duoplasmatron ion source 10 of FIG. 1. The focused O⁻ primary beam size was measured in order to determine the beam current density. Beam size was measured using an aluminum grid pressed into a flat copper disc. The grid bars are 8 µm thick on 25 µm centers. FIG. 5 shows step scan results of scanning the focused O- beam across the edge of an aluminum grid bar and monitoring the positive aluminum ($Al^+$) secondary ion counts as a function of beam position. The accepted definition of beam size is the distance over which the signal drops from 84% to 16% of the maximum. This means that 68% of the beam current is within the measured range, or ±1 standard deviation for a Gaussian beam shape.

The beam diameter in the plot is 2.0 µm. For a beam current of 0.8 nA, the calculated beam current density is 25 mA/cm². This is probably a minimum value as there must be some roughness in the Al grid edge. The comparable factory specification for the traditional duoplasmatron source is 10 mA/cm².

Ion microprobe performance: The factory specifications for the ion microprobe using a traditional duoplasmatron source are (with beam diameter defined by the 16%-84% criterion noted above):
  Smallest achievable beam diameter on sample surface
    ≤200 nm
  Beam diameter ≤400 nm for Ip=2 pA O⁻

Figure 6A:
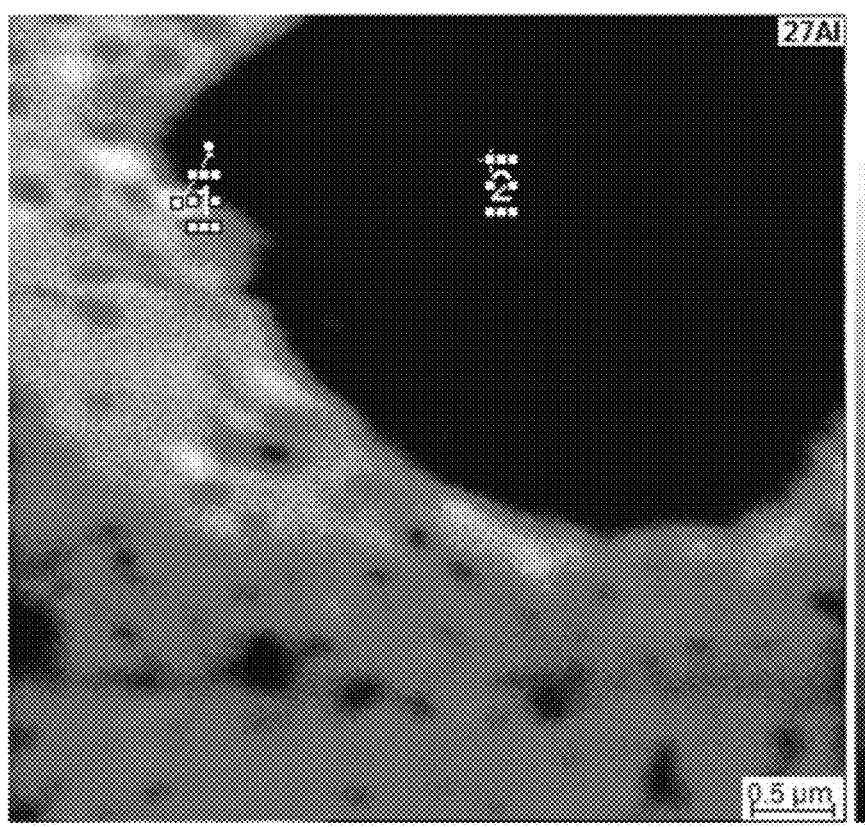
FIG. 6A is a first ion microprobe image obtained using a test sample and the duoplasmatron ion source of FIG. 1.
Figure 6B:
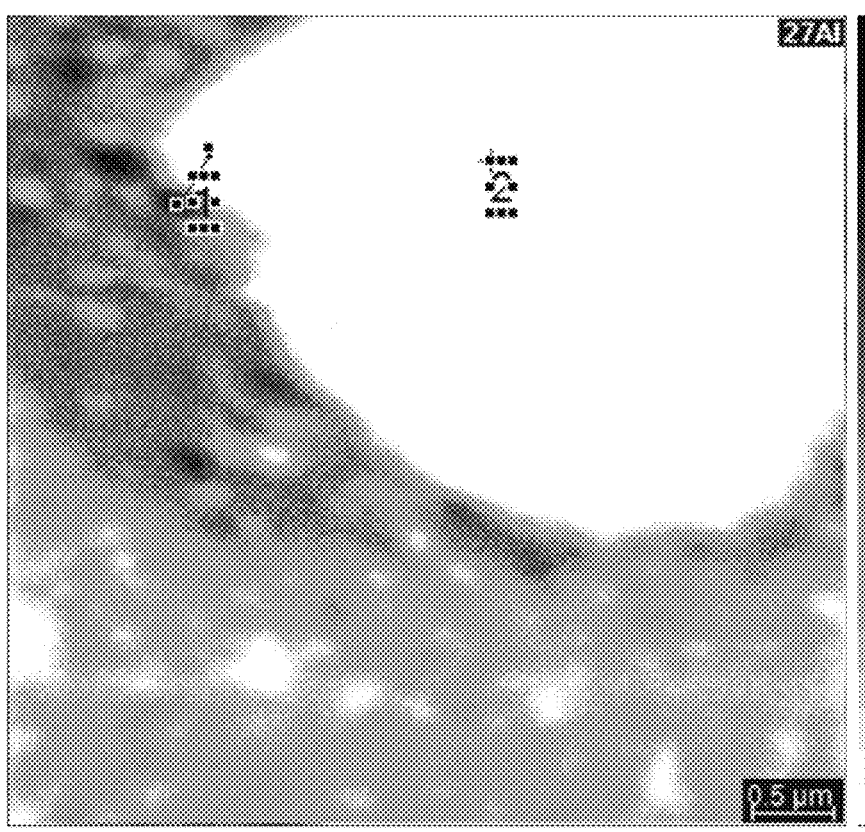
FIG. 6B is a color inverted version of the image of FIG. 6A.
Figure 6C:
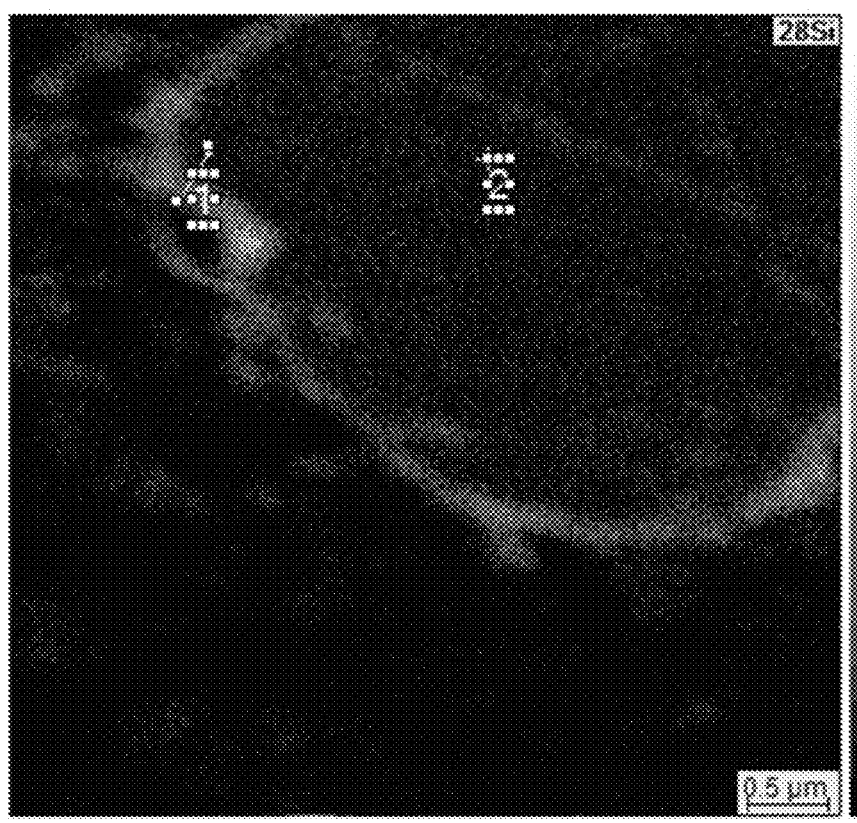
FIG. 6C is a second ion microprobe image obtained using a test sample and the duoplasmatron ion source of FIG. 1.
Figure 6D:
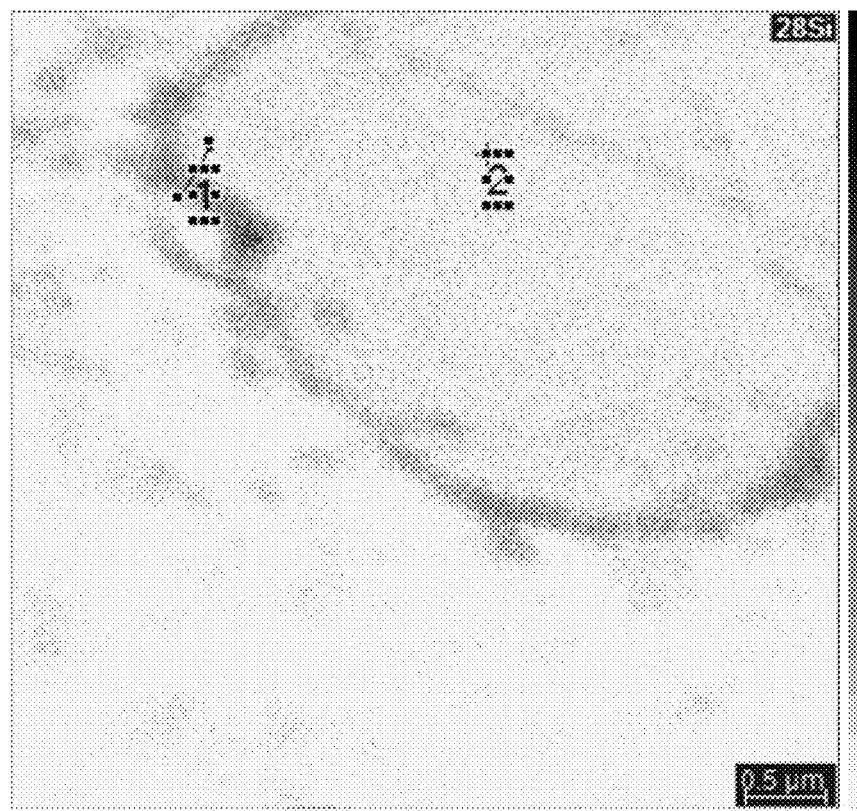
FIG. 6D is a color inverted version of the image of FIG. 6C.

FIGS. 6A and 6C are images from an ion microprobe of a test sample produced using the duoplasmatron ion source 10 of FIG. 1. The images were produced with a focused O⁻ beam produced using the partially ferromagnetic anode insert 134 having a 400 µm ion extraction aperture 120. The test sample consists of silicon particles pressed into aluminum metal and then polished to a flat surface. The images of FIGS. 6A and 6C were obtained by scanning the focused O⁻ ion beam over a 10 µm square area and monitoring the signal intensities of sputtered $Al^+$ and positive silicon (Si+) secondary ions.

Figure 7:
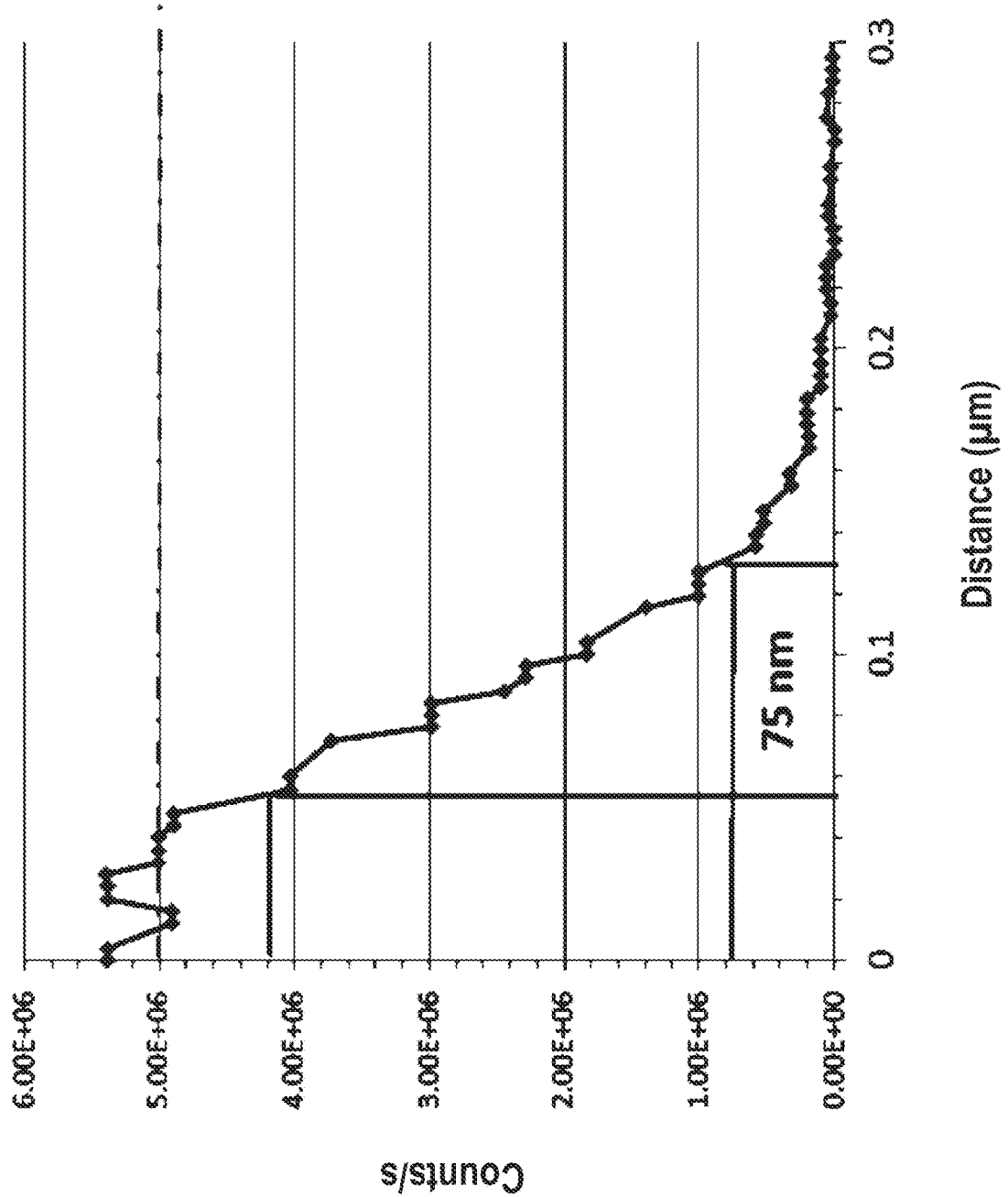
FIG. 7 is a graphical representation of a line scan of positive aluminum (Al) ion image intensity across a sharp edge in the test sample image of FIG. 6A.

FIG. 7 is a graphical representation of a line scan of $Al^+$ ion image intensity across a sharp edge in the test sample image of FIG. 6A. The line scan was taken across an edge in the upper left corner of the image. Using the 84%-16% definition noted above, the beam size is calculated as 75 nm. The primary current for this measurement was 0.25 pA. The current for the smallest beam size using the traditional duoplasmatron source (<200 nm) is not specified by the manufacturer but is probably in a similar range.

The beam current density for the performance shown in FIG. 7 is 5.7 mA/cm². For the traditional duoplasmatron source specification of 2 pA into 400 nm beam diameter, the current density is 1.6 mA/cm². Under identical conditions, the maximum current with the traditional duoplasmatron source is 250-300 nA; with the partially ferromagnetic anode insert 134 an O⁻ current of 1.2 µA was obtained (these maximum current numbers differ from the ion microscope numbers because the primary ion column design is different and a different ion extraction aperture diameter was used, so only comparisons made on the same instrument are valid).

In summary, the performance improvement of the partially ferromagnetic anode insert 134 is very similar on both SIMS instrument designs described above. Compared to the traditional duoplasmatron source, maximum O⁻ current is a factor of 4-6 greater; beam current density is greater than the traditional duoplasmatron source by a factor of at least 2.5 on the ion microscope and a factor of 3 on the ion microprobe, and the smallest beam diameter on the ion microprobe is a factor of 2.7 smaller than the traditional duoplasmatron source.

It should be noted that the maximum $O_2^+$ current in the ion microscope also shows an improvement factor of 4-5 compared to the traditional duoplasmatron ion source with a fully magnetic anode, even though for positive ion extraction both sources were operated with the Z-electrode 18 on-axis. This may be a result of the conical design of the partially ferromagnetic anode insert 134.

Figure 8:
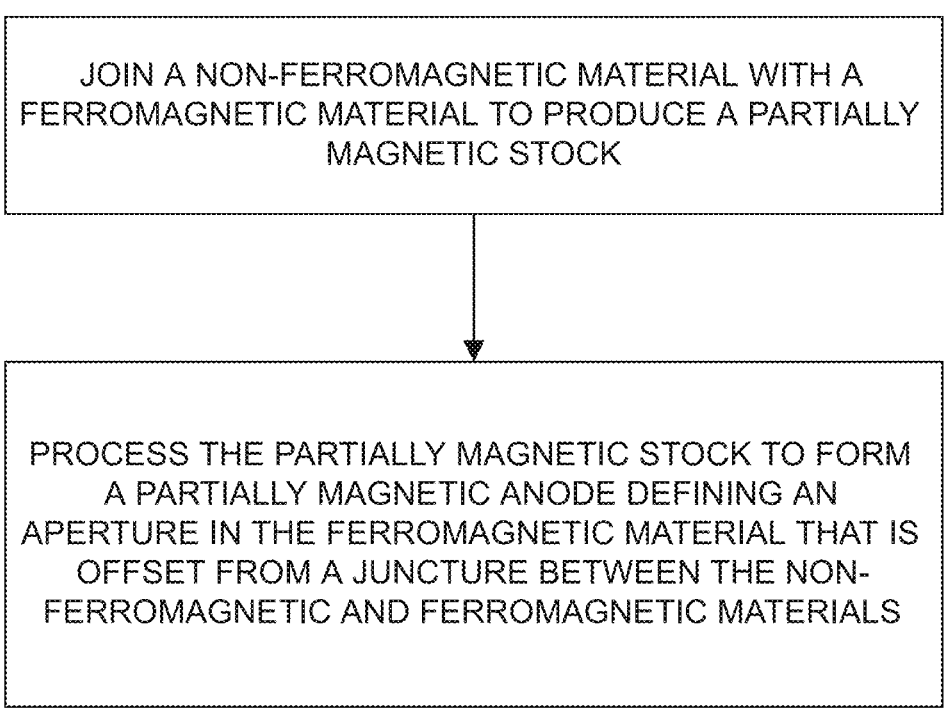
FIG. 8 is a flow diagram illustrating a process for producing a partially ferromagnetic anode for a duoplasmatron ion source according to one embodiment.

FIG. 8 is a flow diagram illustrating a process for producing a partially ferromagnetic anode for a duoplasmatron ion source 10. The process begins at operation 700, with joining a non-ferromagnetic material with a ferromagnetic material to produce a partially ferromagnetic stock (i.e., a workpiece subject to further processing to form a partially ferromagnetic anode). In an exemplary aspect, the non-ferromagnetic material is brazed with the ferromagnetic material. The process continues at operation 702, with processing (e.g., machining) of the partially ferromagnetic stock to form a partially ferromagnetic anode comprising a juncture between the non-ferromagnetic material and the magnetic material that is laterally offset from the ion extraction aperture.

Although the operations of FIG. 8 are illustrated in a series, this is for illustrative purposes and the operations are not necessarily order dependent. Some operations may be performed in a different order than that presented. For example, at least some of the machining may be performed before joining the non-ferromagnetic material with the ferromagnetic material. Further, processes within the scope of this disclosure may include fewer or more steps than those illustrated in FIG. 8.

As described above with respect to FIGS. 5-8, the duoplasmatron ion source 10 of FIG. 1, with the partially ferromagnetic anode insert 134 of FIGS. 3A-3B, is useful for multiple applications, including secondary ion mass spectrometers and particle accelerators. The partially ferromagnetic anode insert 134 may be fabricated from a brazed (or otherwise joined) ferromagnetic (e.g., soft iron) and non-ferromagnetic (e.g., 321 stainless steel alloy) partially ferromagnetic stock to produce an asymmetric magnetic field in the ion extraction region (e.g., between the ion extraction aperture 120 and the Z-electrode 18).

The juncture between the ferromagnetic portion (140 in FIGS. 3A-3B) and non-ferromagnetic portion (142 in FIGS. 3A-3B) is sufficiently far off-center (e.g., 5 mm in the exemplary embodiment depicted in FIGS. 3A-3B) that the magnetic field in the region of the ion extraction aperture 120 is minimally affected by the magnetic field asymmetry, and remains close to the optimal axial symmetry. The distorted magnetic field in the acceleration gap arising from the asymmetric ferromagnetic/non-ferromagnetic construction of the anode 22 piece suppresses electron extraction from the ion extraction aperture 120 when this ion extraction aperture is arranged coaxially with the Z-electrode aperture 38, allowing extraction of either positive or negative ions from the central, most intense region of the source plasma.

In some examples, at least a portion of the anode 22 (such as a partially ferromagnetic anode insert 134 illustrated in FIGS. 3A-3B) has a conical shape (e.g., convex toward the Z-electrode 18 in FIG. 1), so that the magnetic field in the gap between the anode 22 and Z-electrode 18 is concentrated at the apex of the cone where the ion extraction aperture 120 is positioned. The anode 22 region in which the ion extraction aperture 120 is drilled can be ferromagnetic soft iron or a similar material, which further optimizes the magnetic field in the vicinity of the ion extraction aperture 120.

Performance improvement factors of approximately 4-6 are achieved in maximum negative ion beam current and ion beam current densities in both the ion microscope and ion microprobe instrument designs, and minimum focused spot size (e.g., in the ion microprobe) is reduced by a factor of 2.7.

Those skilled in the art will recognize improvements and modifications to the preferred embodiments of the present disclosure. All such improvements and modifications are considered within the scope of the concepts disclosed herein and the claims that follow.

What is claimed is:

1. A duoplasmatron ion source configured to be positioned proximate to a grounded electrode, the duoplasmatron ion source comprising:
   a cathode;
   an anode;
   a Zwischen electrode (Z-electrode) arranged between the cathode and the anode, and defining a Z-electrode aperture; and
   wherein the anode comprises a partially ferromagnetic region that comprises a ferromagnetic portion joined with a non-ferromagnetic portion at a juncture, the ferromagnetic portion defining an ion extraction aperture arranged adjacent to the Z-electrode aperture;
   wherein the juncture is laterally offset from the ion extraction aperture; and
   wherein the partially ferromagnetic anode region is configured to produce a magnetic field that reduces or eliminates transit of electrons from the ion extraction aperture to contact the grounded electrode.

2. The duoplasmatron ion source of claim 1, wherein the anode further comprises a removable insert that forms the partially ferromagnetic region.

3. The duoplasmatron ion source of claim 2, wherein the removable insert comprises a threaded surface configured to engage a threaded receiving aperture of the anode.

4. The duoplasmatron ion source of claim 1, wherein the juncture is laterally offset from the ion extraction aperture by a distance of at least 3 mm.

5. The duoplasmatron ion source of claim 1, wherein the juncture is laterally offset from the anode aperture by a distance of approximately 5 mm.

6. The duoplasmatron ion source of claim 1, wherein each of the ferromagnetic portion and the non-ferromagnetic portion is metallic.

7. The duoplasmatron ion source of claim 6, wherein the ferromagnetic portion comprises a ferrous metal.

8. The duoplasmatron ion source of claim 7, wherein the non-ferromagnetic portion comprises a non-ferromagnetic stainless steel alloy.

9. The duoplasmatron ion source of claim 1, being configured to produce at least one of positive ions or negative ions.

10. The duoplasmatron ion source of claim 1, being configured to produce negative ions, wherein the Z-electrode aperture is coaxially aligned with the ion extraction aperture.

11. The duoplasmatron ion source of claim 1, wherein:
the partially ferromagnetic anode region has a conical cross-sectional shape that is convex toward the Z-electrode.

12. A partially ferromagnetic anode for a duoplasmatron ion source configured to be positioned proximate to a grounded electrode and configured to form part of a magnetic circuit, the partially ferromagnetic anode comprising:
a partially ferromagnetic region that comprises a ferromagnetic portion joined with a non-ferromagnetic portion at a juncture, the ferromagnetic portion defining an ion extraction aperture;
wherein the juncture is laterally offset from the ion extraction aperture; and
wherein the partially ferromagnetic region is configured to produce a magnetic field that reduces or eliminates transit of electrons from the ion extraction aperture to contact the grounded electrode.

13. The partially ferromagnetic anode of claim 12, wherein the partially ferromagnetic anode comprises a removable insert that forms the partially ferromagnetic region.

14. The partially ferromagnetic anode of claim 12, wherein the removable insert comprises a threaded surface configured to engage a threaded receiving aperture of a ferromagnetic remainder of the anode.

15. The partially ferromagnetic anode of claim 12, wherein the partially ferromagnetic region is formed integrally with a remainder of the partially ferromagnetic anode.

16. The partially ferromagnetic anode of claim 12, wherein the juncture is laterally offset from the ion extraction aperture by a distance of at least 3 mm.

17. The partially ferromagnetic anode of claim 12, wherein:
at least a portion of the partially ferromagnetic region defining the ion extraction aperture has a conical cross-sectional shape;
the partially ferromagnetic anode separates an upstream region containing an ion-producing discharge and a downstream region through which ions are accelerated toward the grounded electrode; and
the partially ferromagnetic anode is convex in a direction toward the upstream region.

18. A method for producing a partially ferromagnetic anode for a duoplasmatron ion source, the method comprising:
joining a non-ferromagnetic material with a ferromagnetic material at a juncture to produce a partially ferromagnetic stock; and
processing the partially ferromagnetic stock to form a partially ferromagnetic anode region, wherein the ferromagnetic portion defines an ion extraction aperture, and the juncture is laterally offset from the ion extraction aperture.

19. The method of claim 18, wherein joining the non-ferromagnetic material with the ferromagnetic material comprises brazing a ferromagnetic metal with a non-ferromagnetic metal.

20. The method of claim 18, wherein processing the partially ferromagnetic stock comprises forming at least a portion of the partially ferromagnetic anode region into a conical shape.

* * * * *